(12) United States Patent
Izumi

(10) Patent No.: US 6,446,646 B1
(45) Date of Patent: Sep. 10, 2002

(54) SUBSTRATE PROCESSING APPARATUS

(75) Inventor: Akira Izumi, Shiga (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 09/086,650

(22) Filed: May 29, 1998

(30) Foreign Application Priority Data

Jun. 3, 1997 (JP) ............................................. 9-145203

(51) Int. Cl.$^7$ .............................................. B08B 17/00
(52) U.S. Cl. ........................... 134/66; 134/78; 134/134; 134/200; 134/902
(58) Field of Search ........................... 118/715; 134/66, 134/68, 78, 79, 80, 134, 200, 902

(56) References Cited

U.S. PATENT DOCUMENTS

| | | | |
|---|---|---|---|
| 3,916,651 A | * | 11/1975 | Carruthers |
| 4,415,385 A | * | 11/1983 | Saito et al. .................. 148/189 |
| 4,592,800 A | * | 6/1986 | Landau et al. |
| 4,661,196 A | * | 4/1987 | Hockersmith et al. |
| 4,693,777 A | * | 9/1987 | Hazano et al. |
| 4,820,777 A | * | 4/1989 | Davis et al. .................. 134/1.1 |
| 4,838,476 A | * | 6/1989 | Rahn |
| 4,909,695 A | * | 3/1990 | Hurwitt et al. |
| 5,135,608 A | * | 8/1992 | Okutani ....................... 438/584 |
| 5,145,303 A | * | 9/1992 | Clarke |
| 5,248,886 A | * | 9/1993 | Asakawa et al. |
| 5,304,405 A | * | 4/1994 | Kobayashi et al. |
| 5,308,791 A | * | 5/1994 | Horiike et al. |
| 5,313,695 A | * | 5/1994 | Palen |
| 5,314,509 A | * | 5/1994 | Kato et al. |

FOREIGN PATENT DOCUMENTS

| | | | |
|---|---|---|---|
| JP | 4-196531 | * | 7/1992 |
| JP | 5-217918 | | 8/1993 |
| JP | 5-217919 | | 8/1993 |

* cited by examiner

Primary Examiner—Frankie L. Stinson
(74) Attorney, Agent, or Firm—Ostrolenk, Faber, Gerb & Soffen, LLP

(57) ABSTRACT

Chambers each include an inlet port for supplying $N_2$ gas and an outlet port for discharging an inner atmosphere, and therefore the chambers have different amounts of supply of $N_2$ gas in a unit of time and different amounts of discharge of inner atmosphere in a unit of time. With this structure, the first to fourth processing chambers are controlled to have the lowest inner pressure($p3$), a transfer module is controlled to have an inner pressure ($p2$) higher than the inner pressure ($p3$) and a loader and an unloader are controlled to have the highest inner pressure ($p1$). That eliminates the necessity for keeping the whole substrate processing apparatus at the highest inner pressure ($p1$) and supplying a large amount of $N_2$ gas, and therefore it is possible to achieve processings of substrate at lower cost, with shorter purge time and less contamination of substrate.

9 Claims, 6 Drawing Sheets

SUBSTRATE PROCESSING APPARATUS

BACKGROUND OF THE INVENTION

Field of the Invention

The present invention relates to a substrate processing apparatus including a plurality of adjacent chambers, which performs various kinds of processings on a liquid crystal glass square substrate, a semiconductor wafer or the like (hereinafter referred to simply as "substrate") while transferring the substrate between the chambers.

Description of the Background Art

Among conventional apparatus for performing a substrate processing such as film formation and cleaning in processing chambers while transferring a substrate between the chambers are those disclosed in Japanese Patent Application Laid Open Gazettes 5-217918 and 5-217919. In these substrate processing apparatus, since the substrate processing is apt to be easily affected by contamination due to unnecessary natural oxide films formed by oxygen and deposit of particles, the chambers are supplied with $N_2$ (nitrogen) gas as an inert gas to increase pressures of their inner atmosphere, thereby discharging oxygen in the chambers and suppressing inflow of oxygen and particles from the outside, to prevent contamination of substrate.

Further, opening a gate valve of a chamber during loading of the substrate into the chamber and closing it after processing and unloading of the substrate, the above apparatus performs the various kinds of processings of the substrate in the chambers while sequentially transferring the substrate.

Anyway, in the above apparatus, all the chambers are supplied with the same amount of $N_2$ gas in a unit of time. Further, from the nature of the substrate processing, it is required that a concentration of oxygen should become lower from the upstream of a substrate processing process to the downstream. Therefore, in order to set low oxygen concentration in the chambers on the downstream, it is necessary to set the same oxygen concentration in all the chambers as the chambers on the downstream which need the lowest concentration, and that needs supply of a large amount of $N_2$ gas.

Moreover, the above apparatus requires longer time to supply a large amount of $N_2$ gas so as to fill the chambers with $N_2$ gas, which include air flowing therein from the outside in loading a substrate from the outside and unloading a processed substrate to the outside (hereinafter, the required time is referred to as "purge time").

SUMMARY OF THE INVENTION

The present invention is directed to an apparatus for processing a substrate. According to the present invention, the apparatus comprises: (a) a transfer chamber having transfer means for transferring the substrate; (b) a group of chambers arranged around the transfer chamber, the group of chambers comprising (b-1) a loading chamber for loading the substrate into the transfer chamber; (b-2) an unloading chamber for unloading the substrate from the transfer chamber; and (b-3) a plurality of processing chambers for processing the substrate; (c) inert-gas supply means for supplying at least the transfer chamber, the unloading chamber and the plurality of processing chambers with an inert gas; and (d) control means for controlling inner pressures of the unloading chamber, the transfer chamber and each of the plurality of processing chambers so that the following first inequality is satisfied at least during an inter-chamber transfer of the substrate, the first inequality being expressed as $pU>pT>pS$ where $pU$ represents an inner pressure of the unloading chamber, $pT$ represents an inner pressure of the transfer chamber, and $pS$ represents an inner pressure of each of the plurality of processing chambers.

Preferably, the control means controls the inner pressures of the unloading chamber and the transfer chamber so that the following second inequality is satisfied at least immediately before the inter-chamber transfer of the substrate, the second inequality being expressed as $pL>pT$ where $pL$ represents an inner pressure of the loading chamber.

The apparatus of the present invention eliminates the necessity for keeping the whole apparatus at high pressure by supplying the inert gas since it is not necessary to set the same oxygen concentration in the whole apparatus as that in a chamber where the lowest oxygen concentration is required. Without the need for a large amount of inert gas, the processings of substrate can be performed by supplying small amount of inert gas, with less contamination of the substrate at lower cost.

Further, even when the supply of inert gas is performed in a state where a large amount of air flows in from the outside during transfer of the substrates, it is not necessary to supply a large amount of inert gas to the whole apparatus and therefore the purge time for the inert gas becomes shorter.

Preferably, the apparatus further comprises (e) inneratmosphere outlet means connected to the loading chamber.

When the loading chamber is supplied with the inert gas to lower the inner oxygen concentration, the supply of the inert gas can be performed after discharging inner air of the loading chamber, requiring a smaller amount of inert gas. Therefore, the processings of substrate can be achieved at much lower cost with shorter purge time.

Preferably, each or any of the plurality of processing chambers comprises a processing body for performing a processing on the substrate; and a sub-transfer unit for transferring the substrate between the processing body and the transfer chamber.

Since the atmosphere containing a large amount of oxygen and particles in the processing body is not sucked directly into the transfer chamber also when the substrate is transferred between the processing body and the transfer chamber, unnecessary supply of inert gas is avoided and the processing of substrate can be achieved at much lower cost.

An object of the present invention is to provide a substrate processing apparatus capable of performing a processing of substrate with less contamination, with a shorter purge time, at lower cost.

These and other objects, features, aspects and advantages of the present invention will become more apparent from the following detailed description of the present invention when taken in conjunction with the accompanying drawings.

DESCRIPTION OF THE PREFERRED EMBODIMENTS

1. Mechanical Structure of The First Preferred Embodiment

Figure 1:
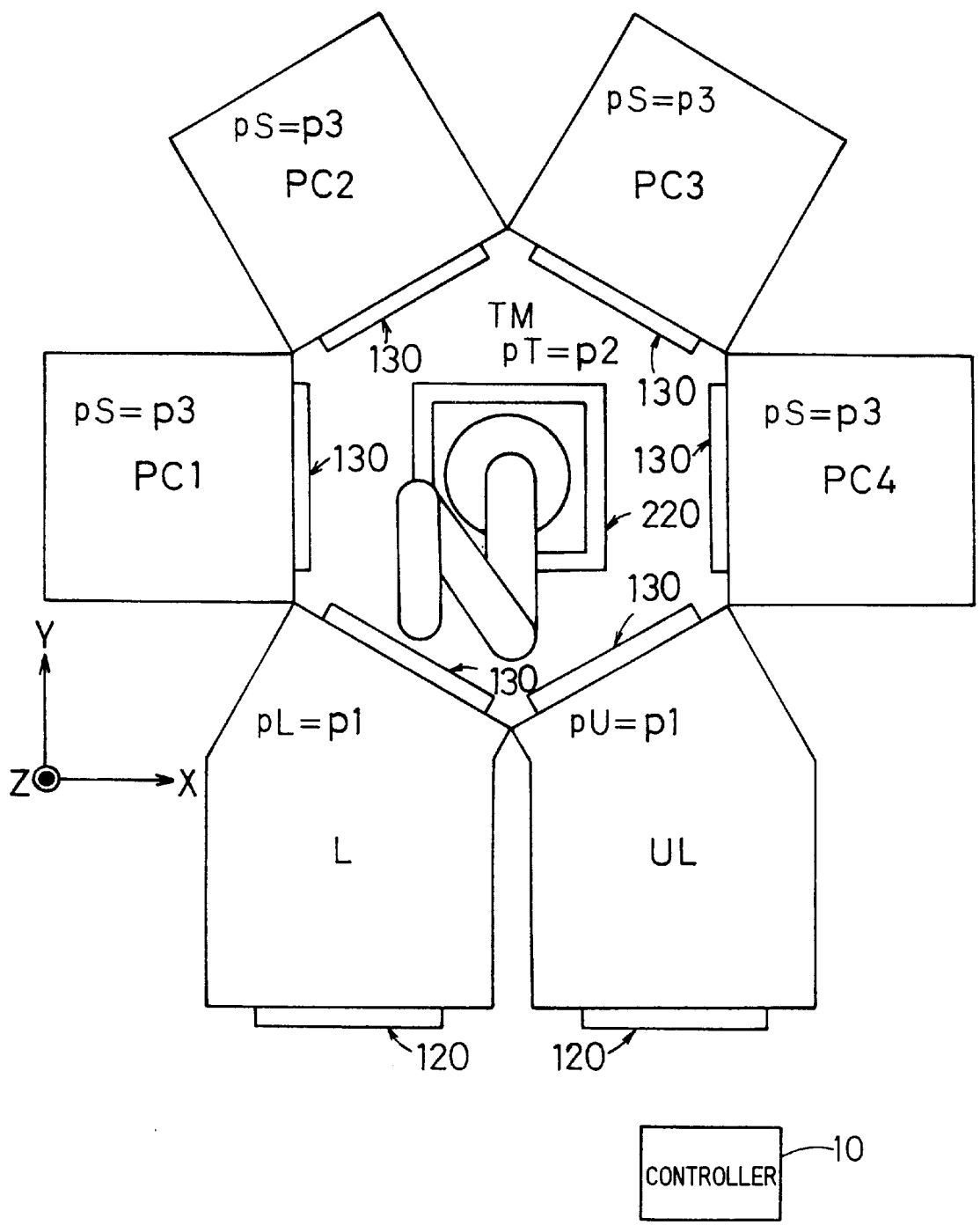
FIG. 1 shows an overall structure of a substrate processing apparatus in accordance with a first preferred embodiment of the present invention.

FIG. 1 shows an overall structure of a substrate processing apparatus 1 in accordance with the first preferred embodiment. In this figure and other figures referred to later, a three-dimensional coordinate X-Y-Z is defined with a horizontal X-Y plane and a vertical Z-axis direction. Now, with reference to FIG. 1, the substrate processing apparatus 1 will be described below.

As shown in FIG. 1, the substrate processing apparatus 1 of cluster type includes a loader L, the first processing chamber PC1, the second processing chamber PC2, the third processing chamber PC3, the fourth processing chamber PC4 and an unloader UL which are radially arranged around a transfer module TM of hexagonal prism. With timing control made by a controller 10 connected to these units but not shown, this substrate processing apparatus 1 performs a chemical processing, a deionized-water cleaning and the like while transferring a plurality of substrates W one by one from the loader L to the first to fourth processing chambers PC1 to PC4 in this order through the transfer module TM, and stores the substrates W after all the processings into a cassette in the unloader UL.

Mechanical structures of these units will be described.

Figure 2:
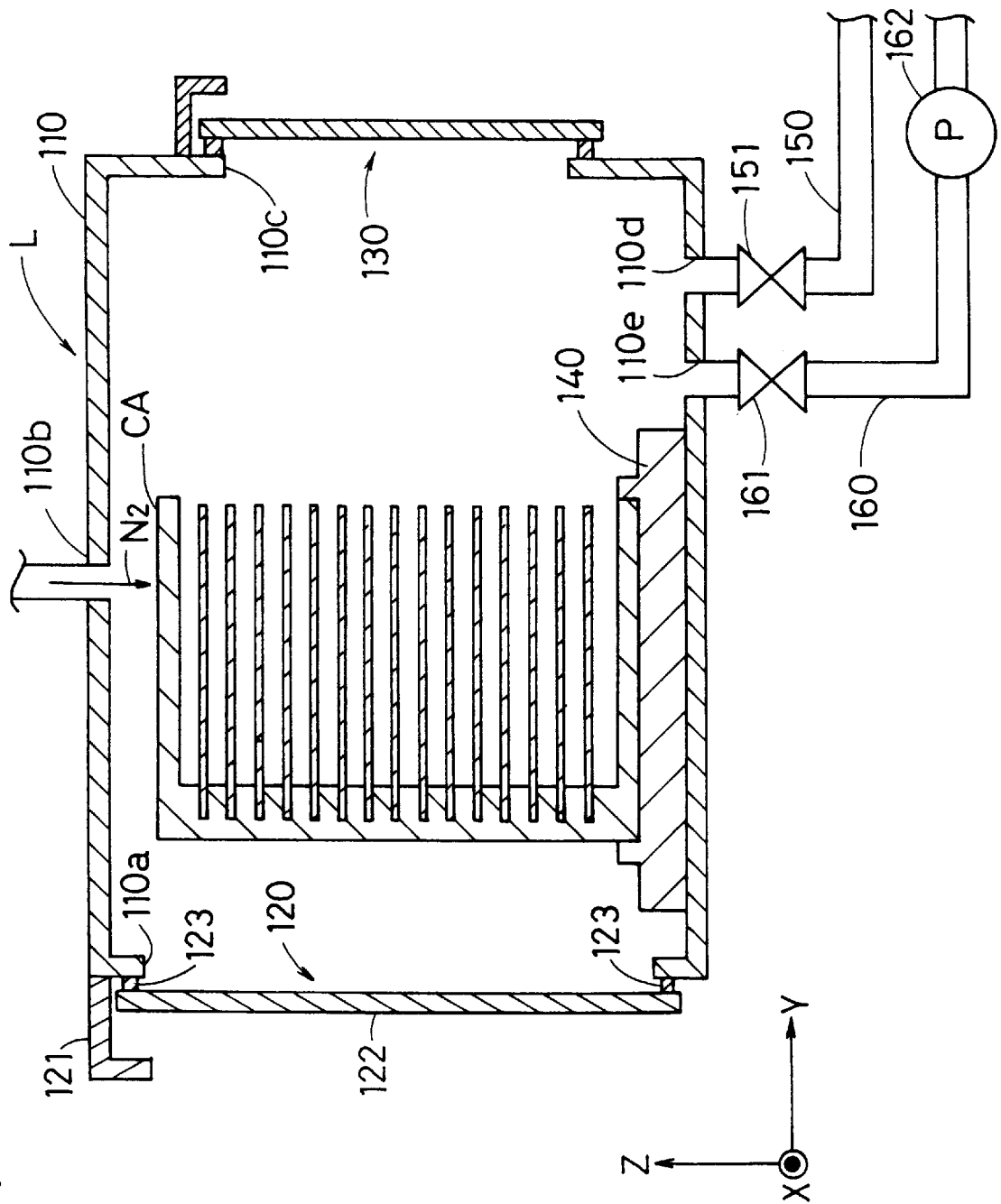
FIG. 2 is a cross section showing a loader in accordance with the first preferred embodiment.

First, mechanical structures of the loader L and the unloader UL will be described. FIG. 2 is a cross section showing the loader L in accordance with the first preferred embodiment. The loader L includes a casing 110 and a cassette holder 140 provided inside the casing 110 for holding a cassette CA. The casing 110 has an opening 110a used for introducing the cassette CA, an inlet port 110b provided in its upper surface for supplying $N_2$ gas, an opening 110c used for loading the substrate W and outlet ports 110d and 110e used for discharging an inner atmosphere.

The openings 110a and 110c of the casing 110 are provided with completely-closable shutters 120 and 130, respectively, to close these openings 110a and 110c. The completely-closable shutter 120 consists of a guide 121 provided on an outer wall surrounding the opening 110a of the casing 110 and a plate member 122 held on the guide 121, being vertically movable, and the opening 110a is opened/closed with the plate member 122 moving vertically. The completely-closable shutter 120 has an elastic member 123 which is so fixed to the outer wall of the casing 110 as to surround the opening 110c, and the plate member 122 is so positioned as to come into close contact with the elastic member 123 when the opening 110a is closed. Therefore, when the completely-closable shutter 120 is closed, an exchange of outer atmosphere is completely cut off. The completely-closable shutter 130 has the same structure as the completely-closable shutter 120.

The cassette holder 140 is provided on an inner bottom surface of the casing 110 and the cassette CA introduced from the outside through the opening 110a is set thereon.

The outlet ports 110d and 110e on the bottom surface of the casing 110 are provided with an outlet pipe 150 with a valve 151 and an outlet pipe 160 with a valve 161, respectively, to discharge the inner atmosphere. The outlet pipe 160 is further provided with a pump 162 to forcefully discharge the inner atmosphere.

In the loader L having this structure, while the atmosphere is controlled, the cassette CA holding a plurality of substrates W to be processed is set on the cassette holder 140 and the substrates W are thereafter discharged one by one through the opening 110C by a mechanical hand 220 as discussed later.

The loader L has the above mechanical structure and the unloader UL has the same mechanical structure as the loader L. Unlike the loader L, the unloader UL receives the processed substrates W from the transfer module TM instead of discharging the substrates W to be processed, and discharges the cassette CA to the outside instead of introducing it from the outside.

Figure 3:
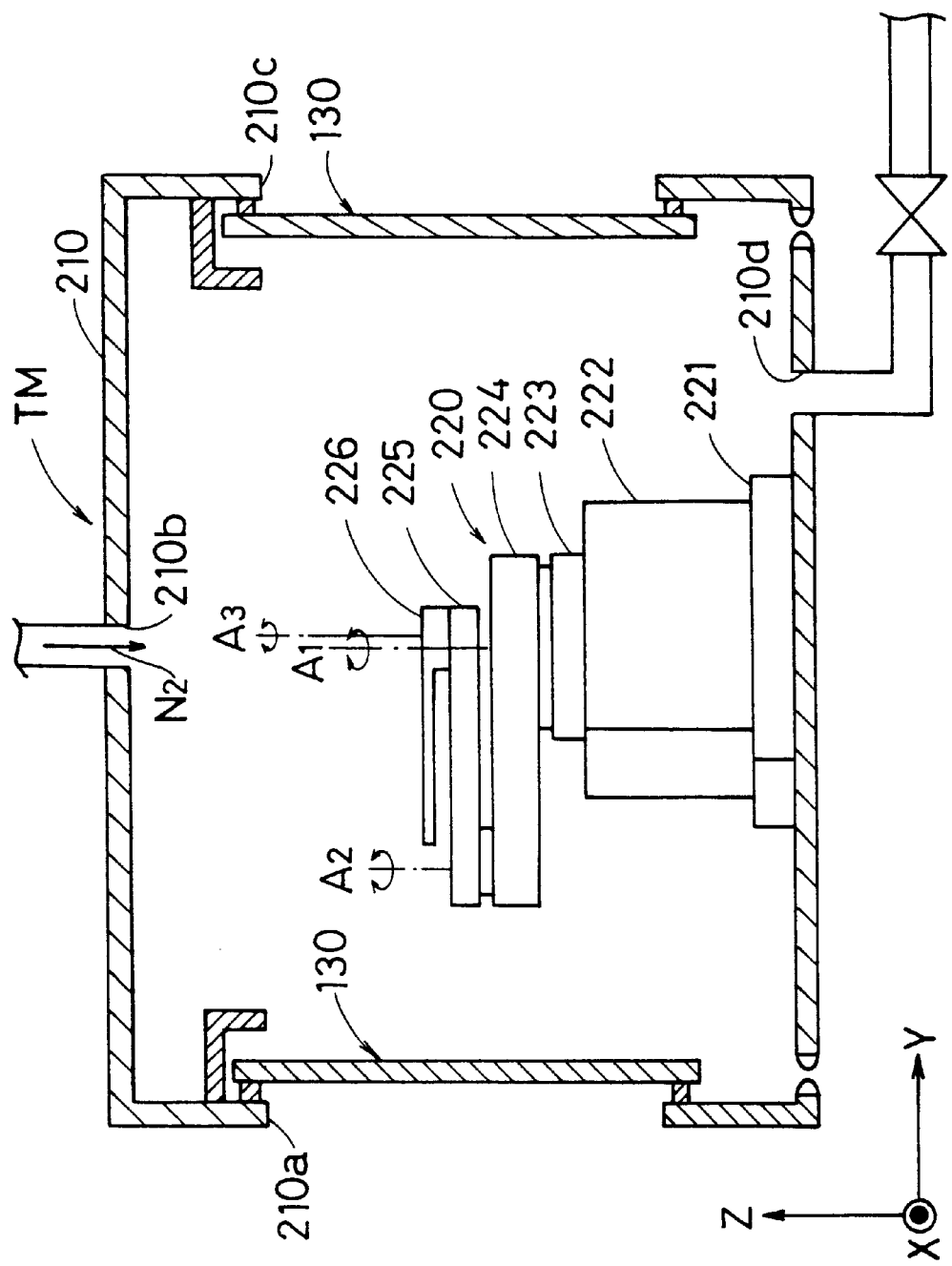
FIG. 3 is a cross section showing a transfer module in accordance with the first preferred embodiment.

Next, a mechanical structure of the transfer module TM will be described. FIG. 3 is a cross section showing the transfer module TM. The transfer module TM has a casing 210 of hexagonal prism whose six faces are provided with respective openings (only openings 210a and 210c are shown in FIG. 3) communicating with chambers for passing the substrates W. The transfer module TM further has an inlet port 210b for supplying $N_2$ gas in its upper surface, an opening 210c for passing the substrates W and an outlet port 210d for discharging the inner atmosphere. These units perform the same actions and play the same parts as corresponding units in the casing 110 of the loader L.

The casing 210 is further provided with the mechanical hand 220 in the center portion on its inner bottom surface. The mechanical hand 220 has a base 221 fixed on the bottom surface of the casing 210 and a body 222 on the base 221, and the body 222 internally has a vertical driving unit 223. The vertical driving unit 223 is provided in a vertically-movable manner, and protrudes out through an opening of an upper surface of the body 222 when goes up and is accommodated inside the body 222 when goes down. The vertical driving unit 223 has the first arm 224 on its upper surface, which horizontally extends and whose one end is rotatably attached around a rotation shaft A1. Further, the vertical driving unit 223 has the second arm 225 whose one end is connected to the other end of the first arm 224, being rotatable around a rotation shaft A2, and a hand 226 whose one end is connected to the other end of the second arm 225, being rotatable around a rotation shaft A3. The first and second arms 224 and 225 and the hand 226 are rotated around the rotation shafts A1, A2 and A3, respectively by rotation of an integrated motor, to make any angles. The hand 226 has a plurality of absorption holes on the other end, thereby absorptively holding the substrates W.

The mechanical hand 220 three-dimensionally moves the hand 226 with the substrates W absorptively held thereon in response to a command from the controller 10. With the hand 226, the mechanical hand 220 receives a substrate W from a chambers through the opening for passing the substrates W and passes the substrate W to another chamber.

The openings for passing the substrates W on the respective sides of the casing 210 communicating with the loader L, the unloader UL and the processing chambers PC1 to PC4 are provided with completely-closable shutters 130, and closing the shutter 130 cuts off an exchange of atmosphere between the transfer module TM and the loader L, the unloader UL or each of the chambers.

Figure 4:
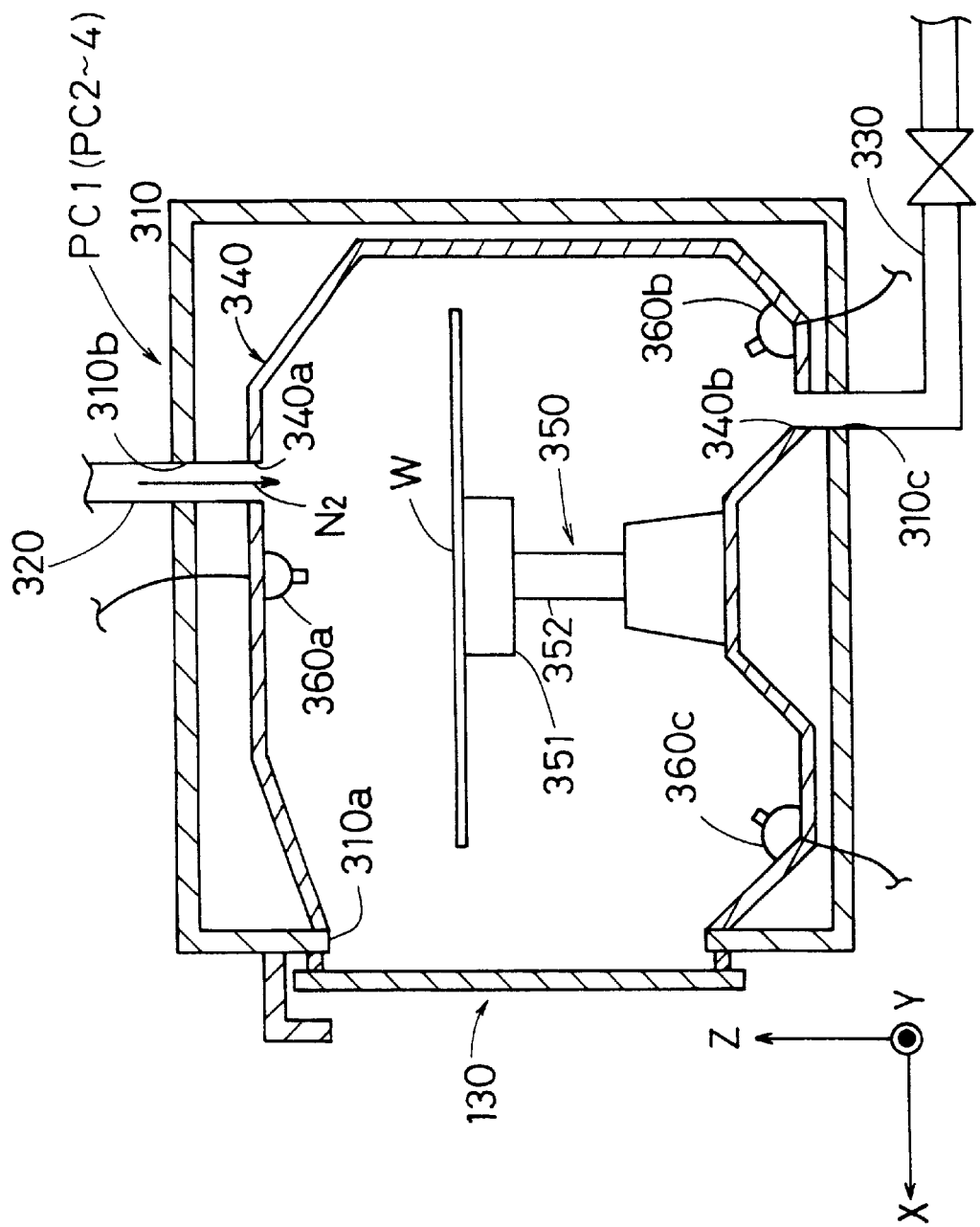
FIG. 4 is a cross section showing the first processing chamber in accordance with the first preferred embodiment.

A mechanical structure of the processing chamber will be described. FIG. 4 is a cross section showing the first processing chamber PC1 in accordance with the first preferred embodiment. The processing chambers PC1 to PC4 have the same mechanical structure in the apparatus of the first preferred embodiment. In this description, the first processing chamber PC1 will be taken as an example. The first processing chamber PC1 has a casing 310 provided with an opening 310a for passing the substrates W on its side surface, an inlet port 310b for supplying $N_2$ gas on its upper surface and an outlet port 310c for discharging the inner atmosphere on its bottom surface.

The casing 310 internally has a closed cup 340. The closed cup 340 has an opening 340a on its upper surface, which is connected to an $N_2$-supply pipe 320 communicating with the outside through the inlet port 310b to supply $N_2$ gas. The closed cup 340 has an outlet port 340b also serving as a drainage port on its bottom surface, which is connected to an outlet pipe 330 communicating with the casing 310 to discharge the inner atmosphere therethrough. The closed cup 340 can cut off the inflow of atmosphere from the outside by closing the completely-closable shutter 130.

The closed cup 340 internally has a spin-type processing unit 350. The spin-type processing unit 350 has a chuck 351 for holding the substrates W on its upper surface, being horizontally rotatable with a driving shaft 352 by driving power of a motor not shown.

The closed cup 340 further has a nozzle 360a in its upper surface and nozzles 360b and 360c in its bottom surface, which are opposed to the substrate W held on the upper surface of the chuck 351. The nozzles inject chemical solution or deionized water supplied by a chemical supply mechanism or a deionized-water supply mechanism both of which are not shown.

With this structure, the first processing chamber PC1 performs a processing of substrate by injecting the chemical solution or deionized water through the nozzles 360a to 360c while rotating the substrates W by the spin-type processing unit 350.

Further, the apparatus 1 includes the controller 10 for controlling processing operations in the chambers and a timing of opening/closing the completely-closable shutters 120 and 130.

The second to fourth processing chambers PC2 to PC4 perform processings of substrate in the same manner as above though use different processing solutions such as chemical solution or deionized water.

The casing of each chamber is made of SUS and covered with Teflon (trademark of ethylene tetrafluoride available from Du Pont) in order to withstand reduced pressure.

2. Characteristic Features of The First Preferred Embodiment

Now, characteristic features of the substrate processing apparatus 1 of the first preferred embodiment will be discussed.

In the substrate processing apparatus 1 of the first preferred embodiment, the processed substrates W gathered in the unloader UL are apt to be easily damaged by contamination due to unnecessary natural oxide films formed by oxygen and deposit of particles. For this reason, as discussed below with reference to FIG. 1, all inner pressures pS of the first to fourth processing chambers PC1 to PC4 are equally controlled to be the lowest inner pressure p3, an inner pressure pT of the transfer module TM is controlled to be an inner pressure p2 higher than the inner pressure p3, and both an inner pressure pL of the loader L and an inner pressure pU of the unloader UL are controlled to be the highest inner pressure p1 by supplying $N_2$ gas.

The air-pressure control by supplying $N_2$ gas will be discussed below in detail. As discussed above, each chamber in the substrate processing apparatus 1 internally has the inlet port for supplying a predetermined amount of $N_2$ gas in a unit of time and the outlet port which has a predetermined diameter, for discharging the inner atmosphere to the outside. In the loader L, the amount of supply of $N_2$ gas in a unit of time is set large and the diameter of the outlet port is set small, to bring its inner pressure to the highest inner pressure p1 at least immediately before the completely-closable shutter 130 is opened to transfer the substrates W into the transfer module TM.

Similarly, in the first to fourth processing chambers PC1 to PC4, the amount of $N_2$ gas flowing in a unit of time through the inlet port is set smaller than that in the loader L, the unloader UL and the transfer module TM and the diameter of the outlet port is set larger than that of the loader L, the unloader UL and the transfer module TM. The inner pressures of the first to fourth processing chambers PC1 to PC4 are thereby brought to the lowest inner pressure p3 at least immediately before the completely-closable shutter 130 is opened to transfer the substrates W from/to the transfer module TM.

In the transfer module TM, naturally, the amount of $N_2$ gas flowing in a unit of time through the inlet port is set smaller than that in the loader L and the unloader UL and larger than that in the first to fourth processing chambers PC1 to PC4, and the diameter of the outlet port is set larger than that of the loader L and the unloader UL and smaller than that of the first to fourth processing chambers PC1 to PC4. The inner pressure of the transfer module TM is thereby brought to the lowest inner pressure p2 at least immediately before the completely-closable shutter 130 is opened to transfer the substrates W from/to the loader L, the unloader UL and the first to fourth processing chambers PC1 to PC4. The relation of inner pressures as discussed above is expressed as:

(inner pressure p1)>(inner pressure p2)>(inner pressure p3)

Specifically, the following relation is held among the inner pressures of the chambers:

$$pU=pL>pT>pS$$

In order to hold the relation of inner pressures, the controller 10 controls the respective completely-closable shutters 130 of the chambers not to open until sufficient time has elapsed to satisfy the above relation. The same applies to other relations of inner pressures discussed below.

Since the inner pressures are set as above in the chambers, when the substrate W is transferred between the transfer module TM and the loader L or the unloader UL, the atmosphere of the loader L or the unloader UL always flows into the transfer module TM. Similarly, when the substrate W is transferred between the transfer module TM and any one of the first to fourth processing chambers PC1 to PC4, the atmosphere of the transfer module TM always flows into the chamber which is to process the substrate W. In this case, the atmosphere flows from a chamber of lower oxygen concentration to another chamber of higher oxygen concentration, and it is permissible that the atmosphere flows from a chamber containing less mist of chemical solution and cleaning solution, particle and the like to another chamber containing relatively much mist, particle and the like in terms of formation unnecessary natural oxide film or contamination of the substrates W.

With the above structure, the substrate processing apparatus 1 of the first preferred embodiment can perform a processing of substrate with less contamination of the substrates W at lower cost since it has no need for keeping an $N_2$ concentration of atmosphere in all the chambers as high as that in the loader L or the unloader UL and does not therefore need a large amount of $N_2$ gas. Moreover, since a large amount of $N_2$ gas is not required, it is possible to cut the purge time.

A large amount of air flows in the loader L and the unloader UL from the outside when the cassette CA is introduced from/discharged to the outside through the opening 110a. For this reason, after closing the completely-closable shutter 120 at the opening 110a when the cassette CA is introduced/discharged, the loader L and the unloader UL discharge their atmosphere containing a large amount of oxygen by using the pump 162 and then are supplied and filled with $N_2$ gas to have the inner pressure p1. Thus, the loader L and the unloader UL do not require a large amount of $N_2$ gas and can perform a processing of substrate at much lower cost with shorter purge time since the loader L and the unloader UL are supplied with $N_2$ gas after discharging the atmosphere even if the atmosphere contains a large amount of oxygen flowing in when the substrates W are introduced/discharged.

Though no particular reference is made to the relation between the inner pressure and the outer pressure of each chamber in the above discussion, in this apparatus, the relation of the inner pressures among the chambers has an influence on contamination of the substrates W but the relation between the inner pressure and the outer pressure does not. Setting the inner pressure on the whole near the atmospheric pressure, however, reduces the amount of supply of $N_2$ gas for the transfer module TM and the first to fourth processing chambers PC1 to PC4 and reduces the required amount of $N_2$ gas on the whole. Therefore, the inner pressure in the whole apparatus is actually set near the atmospheric pressure.

Figure 5:
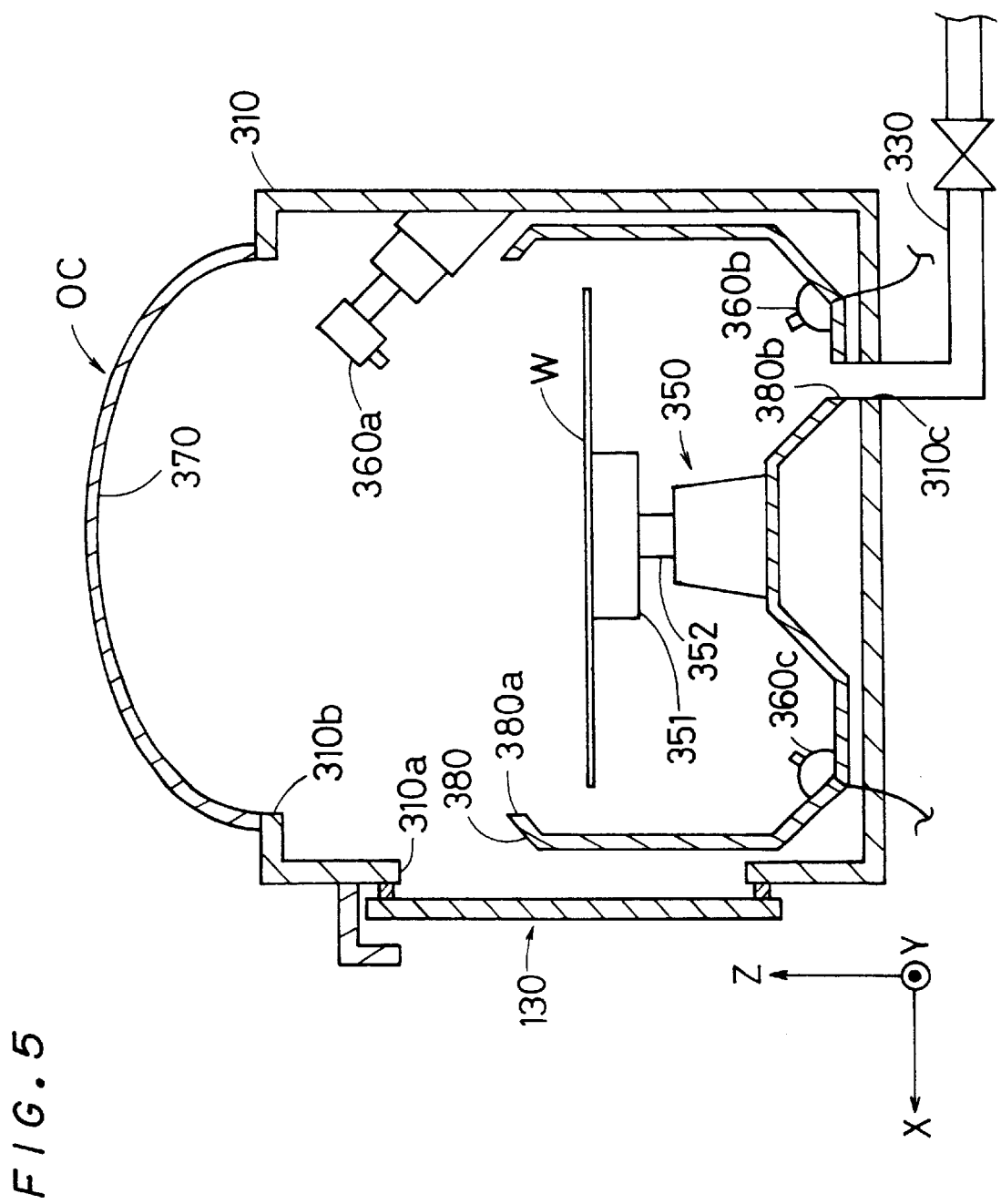
FIG. 5 is a cross section showing an open processing chamber.

Further, since the inner pressure is set near the atmospheric pressure, any chamber among the first to fourth processing chambers PC1 to PC4 whose substrate processing is not easily affected by oxygen may be an open chamber, not a close chamber. FIG. 5 is a cross section showing an open processing chamber OC. The open processing chamber OC includes a cup 380 having an opening 380a in its upper portion, and the atmosphere in the cup 380 and the atmosphere in the casing 310 exchange. Further, the casing 310 has an opening 310a in its upper portion and is provided with a dome-shaped cap 370 to cover the opening 310a. Not completely sealed, clearances between the cap 370 and the periphery of the opening 310a of the casing 310 allows exchange of atmosphere between the inside and outside of the casing 310. When this open processing chamber OC is used, the inner pressure p3 is the atmospheric pressure, and also in this case, the inner pressure p2 of the transfer module TM is kept higher than the inner pressure p3 and the inner pressure p1 of the loader L and the unloader UL is kept higher the inner pressure p2. Other structural features are the same as those of the close processing chambers PC1 to PC4.

Furthermore, in the first preferred embodiment, both the loader L and the unloader UL are supplied with $N_2$ gas and have inner atmospheres of higher pressure than the inner pressure pT of the transfer module TM and oxygen of lower concentration. Therefore, it is not necessary that the inner pressure pL of the loader L and the inner pressure pU of the unloader UL should be equal. Specifically, the inner pressures in the chambers may be:

pU>pT>pS and pL>pT Though both the loader L and the unloader UL are supplied with $N_2$ gas in this preferred embodiment, the loader L may not be supplied with $N_2$ gas.

The relation of the inner pressures among the chambers in this case is expressed as:

pU>pT>pS and pT>pL The reason why the above inequality is satisfied is as follows:

Since the loader L is supplied with no $N_2$ gas, the loader L has an inflow of air to thereby increase an oxygen concentration of the inner atmosphere when it introduces the cassette CA therein. If the substrate W is transferred to the transfer module TM under this condition, the atmosphere of high oxygen concentration flows in the transfer module TM. Then, the atmosphere of high oxygen concentration flows from the transfer module TM into the first to fourth processing chambers PC1 to PC4, resulting in deterioration in quality of the substrates processed in the first to fourth processing chambers PC1 to PC4. Therefore, in order to avoid the inflow of the atmosphere of high oxygen concentration from the loader L into the transfer module TM, the inner pressure of the loader L is set lower than that of the transfer module TM.

Figure 6:
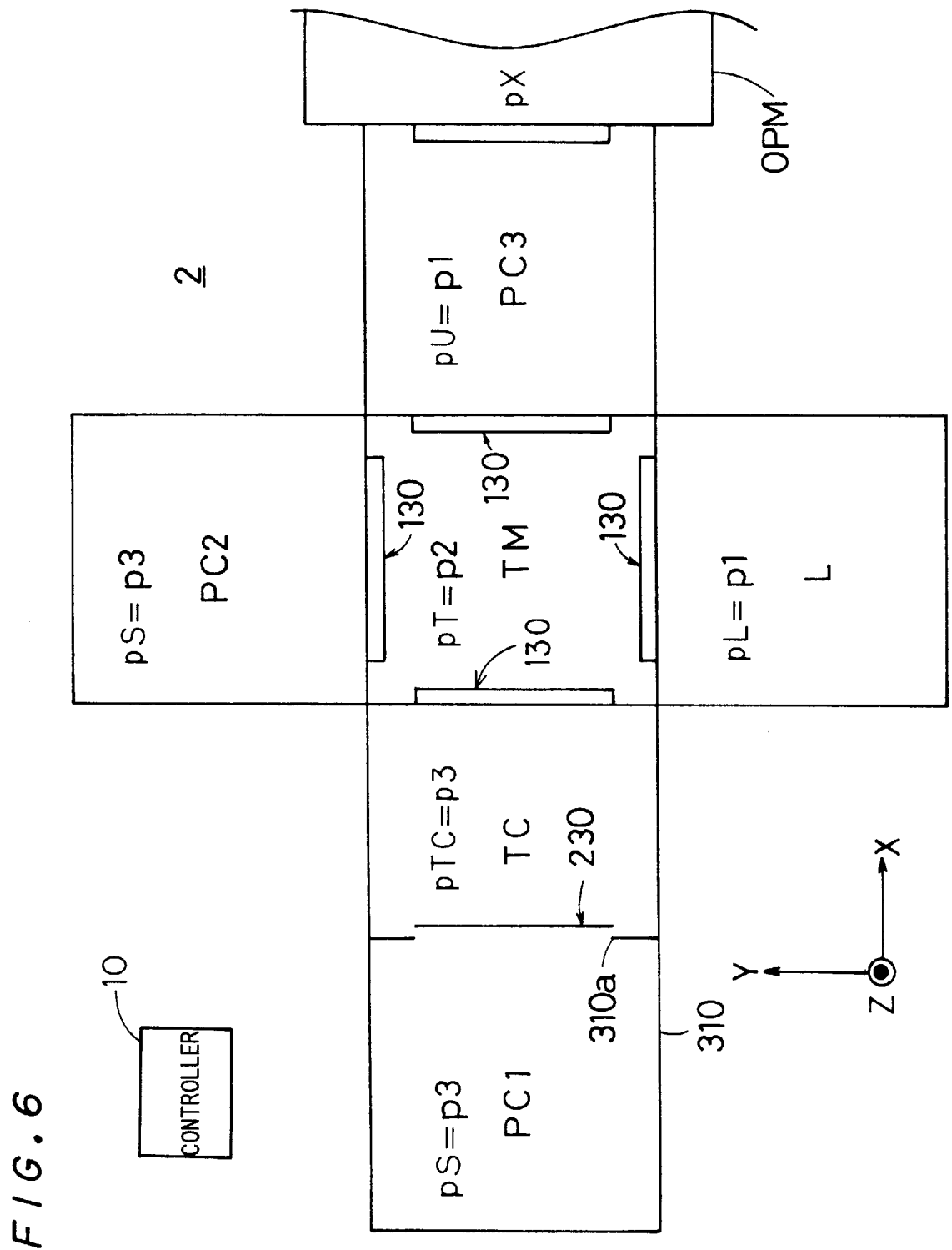
FIG. 6 shows an overall structure of a substrate processing apparatus in accordance with a second preferred embodiment of the present invention.

3. Mechanical Structure and Characteristic Features of The Second Preferred Embodiment FIG. 6 shows an overall structure of a substrate processing apparatus 2 in accordance with the second preferred embodiment. The substrate processing apparatus 2 of the second preferred embodiment will be described below with reference to FIG. 6.

While the substrate processing apparatus 1 of the first preferred embodiment comprises the unloader UL, the substrate processing apparatus 2 of the second preferred embodiment comprises no unloader UL. Instead, the substrate processing apparatus 2 is connected to an external processing apparatus OPM on a side surface of the third processing chamber PC3 which is opposite to another side surface adjacent to the transfer module TM. The substrate W after being performed by the third processing chamber PC3 performing the last processing in the substrate processing apparatus 2 is transferred to the external processing apparatus OPM where another processing is performed on the substrate W, not being transferred to the transfer module TM again. Thus, in the substrate processing apparatus 2 of the second preferred embodiment, a processing chamber may serve also as the unloader UL, or instead of omitting the unloader UL, the loader L may be omitted with a processing chamber used also as the loader L. Further, the transfer module TM of the substrate processing apparatus of the present invention may be connected to another processing apparatus, instead of the loader L, from which the substrate is transferred to the transfer module TM and then the substrate is transferred from the transfer module TM to the first to third processing chambers PC1 to PC3 for substrate processings.

In the substrate processing apparatus 2, the first processing chamber PC1, which performs the processing not easily affected by oxygen, is the open processing chamber OC. Therefore, the atmosphere of the first processing chamber PC1 contains a large amount of oxygen. In the substrate processing apparatus 2, respective inner pressures pS1, pS2 and pTC of the first and second processing chambers PC1 and PC2 and a transfer chamber TC are set to be the lowest inner pressure p3, the inner pressure pT of the transfer module TM is set to be the second lowest inner pressure p2, the inner pressures pU and pL of the third processing chamber PC3 and the loader L are set to be the third lowest pressure p1 and an inner pressure px of the external processing apparatus OPM is set to be the highest inner pressure. The relation of the inner pressures px, p1 to p3 is expressed as:

px>p1>p2>p3 Specifically, the inner pressures of the chambers are:

$$px>pU=pL>pT>pTC=pS$$

As to the inner pressure pU of the third processing chamber PC3, the inner pressure pU is set higher than inner pressure pT and lower than the inner pressure px of the external processing apparatus OPM since the third processing chamber PC3 also serves as an unloader, though the inner pressure pU of the processing chamber PC3 is not generally needed to be higher than the inner pressure pT of the transfer module TM when the processing chamber PC3 serves only as a processing chamber. The relation of the inner pressures among the chambers is satisfied at least immediately before the completely-closable shutter 130 is opened. In other words, like the first preferred embodiment, the controller 10 controls the respective completely-closable shutters 130 of the chambers not to open until sufficient time has elapsed to satisfy the above relation. The same applies to other relations of pressures as shown later.

When the substrate W is transferred between the first processing chamber PC1 and the transfer module TM, there is a slight suck of the atmosphere of the first processing chamber PC1. For this reason, the transfer chamber TC is additionally provided between the transfer module TM and the first processing chamber PC1 in the substrate processing apparatus 2 (where the first processing chamber PC1 corresponds to a processing body and the transfer chamber corresponds to a sub-transfer unit, and these two correspond together to a processing chamber). The transfer chamber TC including the mechanical hand 220 has almost the same structure as the transfer module TM, but is provided with a incompletely-closable shutter 230, instead of the completely-closable shutter 130, at an opening on a side surface adjacent to the first processing chamber PC1. The incompletely-closable shutter 230 has almost the same structure, but without the elastic member 123, it has clearances between the plate member 122 and an outer wall surrounding the opening 310a of the casing 310, allowing slight exchange of atmosphere between the first processing chamber PC1 and the transfer chamber TC.

Thus, in the substrate processing apparatus 2, since the substrates W are transferred between the first processing chamber PC1 and the transfer module TM with the mechanical hand 220 of the transfer chamber TC, the atmosphere containing a large amount of oxygen in the first processing chamber PC1 is not sucked directly to the transfer module TM and therefore the processings can be performed with much less contamination.

The structural features of the chambers and the controller 10 other than the above are the same as those of the substrate processing apparatus 1 of the first preferred embodiment.

Though the inner pressures pL and pU of the loader L and the third processing chamber PC3 are equal in the second preferred embodiment, they may not be equal. In this case, specifically, the inner pressures of the chambers are as follows:

px>pU>pT>pS, and pL>pT

Though the loader L is supplied with $N_2$ gas in the second preferred embodiment, it may not be supplied with $N_2$ gas.

In this case, the inner pressures of the chambers are:

$$px>pU>pT>pS1,\ pS2=pTC,\ and\ pT>pL$$

The reason why the above inequality is satisfied is as follows:

Since the loader L is supplied with no $N_2$ gas, the loader L has an inflow of air to thereby increase an oxygen concentration of the inner atmosphere when it introduces the cassette CA therein. If the substrate W is transferred to the transfer module TM under this condition, the atmosphere of high oxygen concentration flows in the transfer module TM. Then, the atmosphere of high oxygen concentration flows from the transfer module TM into the second and third processing chambers PC2 and PC3 performing the processings easily affected by oxygen, resulting in deterioration in quality of the substrates processed in the second and third processing chambers PC2 and PC3. Therefore, in order to avoid the inflow of the atmosphere of high oxygen concentration from the loader L into the transfer module TM, the inner pressure of the loader L is set lower than that of the transfer module TM.

4. Variations

Though the processing of substrate by the processing chambers in the first and second preferred embodiments is the chemical processing or the cleaning, the processing may be a baking or the like.

Though the loader L and the unloader UL are provided in the apparatus of the first preferred embodiment and only the loader L is provided in the apparatus of the second preferred embodiment, loading and unloading of the substrates W may be made with one cassette CA by providing a unit having both functions of the loader L and the unloader UL.

Though the transfer chamber TC is provided between the first processing chamber PC1 and the transfer module TM in the apparatus of the second preferred embodiment, the transfer chamber TC may be provided between each of chambers and the transfer module TM.

Though the first to fourth processing chambers PC1 to PC4 are provided in the apparatus of the first preferred embodiment and the first to third processing chambers PC1 to PC3 are provided in the apparatus of the second preferred embodiment, more processing chambers may be provided or less processing chambers may be provided.

Though the pressure of the inner atmosphere is controlled by purging the predetermined amount of $N_2$ gas in a unit of time and discharging the inner atmosphere through the outlet port having a predetermined diameter in the first and second preferred embodiments, the amount of supply of $N_2$ gas in a unit of time and the amount of discharge of the inner atmosphere in a unit of time may be controlled in response to variation of the inner pressures of the chambers by providing sensors for the inner pressures of the chambers and providing valves or the like for controlling conductance in the supply pipes of $N_2$ gas and the outlet pipes. The chambers may be supplied with the same amount of $N_2$ gas in a unit of time, and may be provided with outlet ports of different diameters, outlet pipes of different lengths and outlet pipes having different number of bends in order to control the pressure of the inner atmosphere.

Though the inner atmosphere is discharged through the outlet port in the first and second preferred embodiments, the inner atmosphere may be controlled with the amount of supply of $N_2$ gas by providing only the supply mechanism of $N_2$ gas, not particularly providing the outlet port.

Though the inner atmosphere can be discharged by the pumps 162 only in the loader L and the unloader UL in the first and second preferred embodiments, $N_2$ gas may be purged after forcefully discharging the inner atmosphere by providing the same pumps as the pump 162 also in other chambers.

Though the casing of each chamber is made of SUS covered with Teflon (trademark of ethylene tetrafluoride available from Du Pont) in the substrate processing apparatus of the present invention, it may be made of Al covered with Teflon or the like, and the processing chamber may be made of resin such as PVC, PTFF or the like.

While the invention has been shown and described in detail, the foregoing description is in all aspects illustrative and not restrictive. It is therefore understood that numerous modifications and variations can be devised without departing from the scope of the invention.

I claim:

1. An apparatus for processing a substrate, comprising:

(a) a transfer chamber having transfer means for transferring said substrate;

(b) a group of chambers arranged around said transfer chamber, said group of chambers comprising (b-1) a loading chamber for loading said substrate into said transfer chamber;

(b-2) an unloading chamber for unloading said substrate from said transfer chamber; and (b-3) a plurality of processing chambers, at least one of said processing chambers being a chemical chamber for cleaning said substrate;

(c) an inert-gas supply which supplies at least said transfer chamber, said unloading chamber and said chemical chamber with an inert gas; and (d) a controller which controls the inner pressures of said unloading chamber, said transfer chamber and said chemical chamber so that the following first inequality is satisfied at least during an inter-chamber transfer of said substrate, $$pU > pT > pS$$

where pU represents an inner pressure of said unloading chamber, pT represents an inner pressure of said transfer chamber, pS represents an inner pressure of said chemical chamber.

2. The apparatus of claim 1, wherein said controller controls said inner pressures of said unloading chamber and said transfer chamber so that the following second inequality (Eq. 2) is satisfied at least immediately before said inter-chamber transfer of said substrate, $$pL > pT \quad \text{(Eq. 2)}$$

where pL represents an inner pressure of said loading chamber.

3. The apparatus of claim 2, further comprising:

(e) inner-atmosphere outlet connected to said loading chamber.

4. The apparatus of claim 3, wherein said chemical chamber comprises a processing body for performing a cleaning on said substrate; and a sub-transfer unit for transferring said substrate between said processing body and said transfer chamber.

5. The apparatus of claim 4, wherein openings exist between said transfer chamber and said loading chamber, between said transfer chamber and said unloading chamber, and between said transfer chamber and each of said processing chambers, said apparatus further comprising:

(f) a completely-closable shutter for opening/closing each of said openings.

6. The apparatus of claim 1, wherein said controller controls said inner pressures of said unloading chamber and said transfer chamber so that the following third inequality (Eq. 3) is satisfied at least immediately before said inter-chamber transfer of said substrate, $$pT > pL \quad \text{(Eq. 3)}$$

where pL represents an inner pressure of said loading chamber.

7. The apparatus of claim 6, further comprising:

(e) inner-atmosphere outlet connected to said loading chamber.

8. The apparatus of claim 7, wherein said chemical chamber comprises a processing body for performing a cleaning on said substrate; and a sub-transfer unit for transferring said substrate between said processing body and said transfer chamber.

9. The apparatus of claim 8, wherein openings exist between said transfer chamber and said loading chamber, between said transfer chamber and said unloading chamber, and between said transfer chamber and each of said process chambers, said apparatus further comprising:

(f) a completely-closable shutter for opening/closing each of said openings.

* * * * *